United States Patent [19]
Kim et al.

[11] Patent Number: 5,163,064
[45] Date of Patent: Nov. 10, 1992

[54] LASER DIODE ARRAY AND MANUFACTURING METHOD THEREOF

[75] Inventors: Jong R. Kim; Dong S. Bang, both of Seoul, Rep. of Korea

[73] Assignee: Samsung Electronics Co., Ltd., Suweon, Rep. of Korea

[21] Appl. No.: 698,656

[22] Filed: May 10, 1991

[30] Foreign Application Priority Data

Feb. 6, 1991 [KR] Rep. of Korea ............ 91-2034

[51] Int. Cl.$^5$ .................................. H01S 3/19
[52] U.S. Cl. .................................. 372/50; 372/45; 372/46
[58] Field of Search .................. 372/45, 46, 50

[56] References Cited

U.S. PATENT DOCUMENTS

| | | | |
|---|---|---|---|
| 4,786,918 | 11/1988 | Thornten et al. | 372/46 |
| 4,803,691 | 2/1989 | Scifres et al. | 372/50 |
| 5,010,556 | 4/1991 | Imanaka et al. | 372/46 |

Primary Examiner—Georgia Y. Epps
Attorney, Agent, or Firm—Ladas & Parry

[57] ABSTRACT

The present invention relates a laser diode array and its manufacturing method. After formation of V-channels on an N-type GaAs substrate, each layer is formed by molecular beam epitaxy technique. By using that Si acts as P-type dopant on {111} A surface of V-channel, while acting as N-type dopant on {100} surface of the outside of V-channel, a laser array structure is improved. Thus, the present invention is useful in obtaining stable optical output efficiency and mode control, yield improvement, reproducibility, and high output laser beam.

5 Claims, 2 Drawing Sheets

LASER DIODE ARRAY AND MANUFACTURING METHOD THEREOF

BACKGROUND OF THE INVENTION

The present invention relates to a laser diode array and a method of manufacturing the same and more particularly to a phase-locked laser diode array which has a stable high output mode.

Due to the advance of optical communication technology and electronic industrial technology using semiconductor, opto-electronic era is coming near and the laser diode(LD) is spotlighted because of its good efficiency and reliability as well as its small size in data transferring or data recording.

Recently, the investigations on compound semiconductor of which properties are superior, for example GaAs which is not indirect transition type as Si or Ge but direct transition type, are in progress. This compound semiconductor has many superior properties such as high electron mobility, high frequency response, low power consumption, direct transition, and semi-insulativity to Si. Moreover, in the direct transition type semiconductor such as GaAs, the momentum is preserved during the recombination of electron and hole.

Therefore, the life time of charges injected toward the emitting region is so short (less than a few nanoseconds) that the emitting intensity is strong. And because the optical response for the charge of current input is very fast, the compound semiconductor is widely used as light source in the optical communication where fast modulation is required.

FIG. 1 is a vertical cross sectional view of a conventional VSIS(V-channeled Substrate Inner Stripe)-LD.

In the VSIS-LD, and P type GaAs current blocking layer 2 is formed on an N type GaAs substrate 1. Next, a V-channel is formed in a stripe shape by mesa-etching of the N-type GaAs substrate 1 and current blocking layer 2. On the current blocking layer 2, and N-type Alx Ga $_{1-x}$ As layer 3, a P-type GaAs layer 4, a P-type Alx Ga $_{1-x}$ As layer 5, and a P+-type GaAs layer 6 are sequentially stacked. The N-type Alx Ga $_{1-x}$ As layer 3 is used as a first cladding layer, the P-type GaAs layer 4 as an active layer, the P-type Alx Ga $_{1-x}$ As layer 5 as a second cladding layer, and the P+-type GaAs layer 6 as a cap layer.

The first cladding layer 3 fills the V-channel and is electrically connected to the N-type GaAs substrate 1. Also, a P-type electrode 7 is formed on the P+-type GaAs layer 6, while an N-type electrode 8 is formed beneath the N-type GaAs substrate 1. The normal planes to the V-channel are mirror facets.

The VSIS-LD generates light by the recombination of electrons and holes in the active layer 4 when voltage is supplied between the P-type electrode 7 and the N-type electrode 8. In order to limit the generated light inside the P-type GaAs layer 4, the refractive index of the P-type GaAs layer 4 must be larger than those of the N-type Alx Ga $_{1-x}$ As layer 3 and the P-type Alx Ga $_{1-x}$ As layer 5, whereas the energy bandgap of the P-type GaAs layer 4 must be smaller than those of the N-type Alx Ga $_{1-x}$ As layer 3 and the P-type Alx Ga $_{1-x}$ As layer 5.

Thus, the composition ratio X of the compound semiconductor must be in the range from 0 to 1, that is, $0<X<1$. Also, the mirror facets normal to the V-channel reflect or emit the generated light without absorption.

Now, a method of manufacturing the VSIS-LD will be described.

After formation of P-type GaAs layer 2 on the N-type GaAs substrate 1, the V-channel is formed by mesa-etching. Also, the N-type Alx Ga $_{1-x}$ As layer 3, the P-type GaAs layer 4, the P-type Alx Ga $_{1-x}$ As layer 5, and P+-type GaAs layer 6 are sequentially formed on the N-type GaAs layer 2 by LPE (Liquid Phase Epitaxy) technique. Subsequently, the P-type electrode 7 of Au/Zn: Au is formed on the P+-type GaAs layer 6, while the N-type electrode 8 of Au/Ge: Ni: Au is formed beneath the N-type GaAs substrate 1. The P-type and N-type electrodes 7 and 8 forms the ohmic contacts with the P+-type GaAs layer 6 and the N-type GaAs substrate, respectively.

In manufacturing the VSIS-LD described above, there is a problem that two-step epitaxy is needed since the other layers 3,4,5, and 6 should be grown again after growing of the current blocking layer 2. In addition, in the mirror facets, traps due to crystal defects are generated easily. These traps make the energy bandgap so small that the mirror facets are broken because much light is applied onto the same at the time of high output. Moreover, the mode is unstable at the time of laser oscillating and the reproducibility of the mode is not good.

SUMMARY OF THE INVENTION

The object of the invention is to provide an LD array which has a good output efficiency, a stable mode, and a superior reproducibility. Other object of the present invention is to provide a method of manufacturing such an LD array.

According to the present invention, there is provided an LD array comprising: a first semiconductor layer being a second-conductive-type at V-channels of first-conductive-type compound semiconductor substrate on which many V-channels are formed and being a first-conductive-type at the outside of said V-channels, a second semiconductor layer as a first cladding layer, being formed on said first semiconductor layer, a third semiconductor layer of the second-conductive-type as an active layer, being formed on said second semiconductor layer, a fourth semiconductor layer of the second-conductive-type as a second cladding layer, being formed on said third semiconductor layer, a fifth semiconductor layer of the second-conductive-type as a cap layer, being formed on said fourth semiconductor layer, a second-conductive-type electrode formed on said fifth semiconductor layer, and a first-conductive-type electrode formed beneath the first-conductive-type compound semiconductor substrate.

There is also provided a method of manufacturing an LD array comprising the following steps: forming many V-channels by mesa-etching on a first-conductive-type compound semiconductor substrate, forming sequentially first, second, third, fourth, and fifth semiconductor layers on the first-conductive-type compound semiconductor substrate with said V-channels, and forming a second-conductive-type electrode on said fifth semiconductor layer and a first-conductive-type electrode beneath said first-conductive-type compound semiconductor substrate.

BRIEF DESCRIPTION OF THE DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will be now described in more detail with reference to accompanying drawings.

Figure 2:
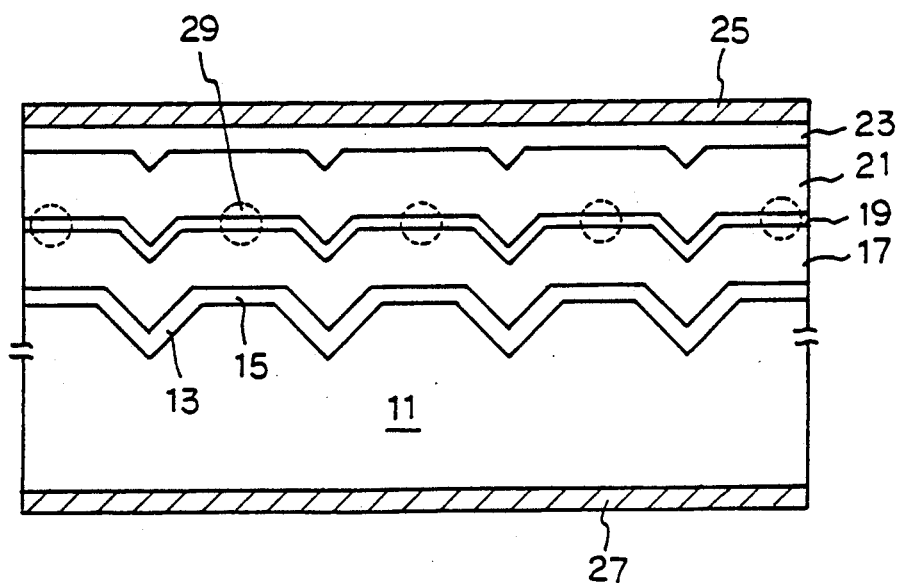
FIG. 2 is a vertical cross sectional view of an LD array according to the present invention.

FIG. 2 is a vertical cross sectional view of an LD array according to the present invention.

A number of V-channels are formed on an N-type GaAs wafer 11 by mesa etching. A P-type GaAs layer 13 (a first semiconductor layer) is formed on the V-channel region, while on the outer region of the V-channel an N-type GaAs layer 15 (a first semiconductor layer) is formed.

On these P-type and N-type GaAs layer, an N-type $Al_xGa_{1-x}As$ layer 17 (a second semiconductor layer), a P-type GaAs layer 19 (a third semiconductor layer), a P-type $Al_xGa_{1-x}As$ layer 21 (a fourth semiconductor layer), and P+-type GaAs layer 23 (a fifth semiconductor layer) are sequentially formed.

At the above, the V-channel regions of the N-type GaAs substrate have the {111} A plane, while the outer regions have the {100} plane. The {111} A plane is formed by etching the N-type GaAs substrate until Ga is exposed. By using the fact that Si becomes P-dopant at the {111} A plane and N-dopant at the {100} plane when Si-doped GaAs layer grown by the MBE method, the P-type GaAs layer is formed on the V-channels, while N-type GaAs layer is formed on the outer regions of the channel, thereby being used as GaAs current blocking layer 13 and 15. Also, the N-type $Al_xGa_{1-x}As$ layer 17, the P-type GaAs layer 19, the P-type $Al_xGa_{1-x}As$ layer 21, and the P+-type GaAs layer 23 are used as a first cladding layer, an active layer, a second cladding layer and a cap layer, respectively. In order to limit the generated light inside the P-type GaAs layer 19, the refractive index of the P-type GaAs layer 19 must be larger than that of the N-type and P-type $Al_xGa_{1-x}As$ layers 17 and 21, while the Energy band gap of the P-type GaAs layer must be smaller than that of the N-type and P-type $Al_xGa_{1-x}As$ layers. Thus, the composition ratio X must be between 0 and 1.

Figure 3A:
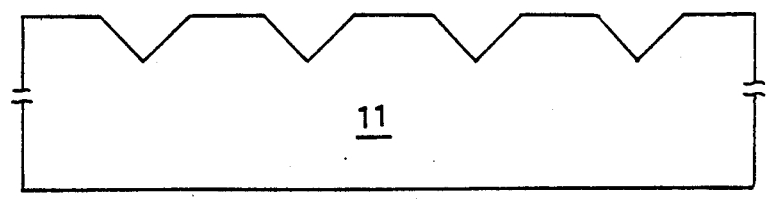
FIGS. 3(A)–3(C) are series of cross sectional views useful in explaining the sequence of manufacturing the LD array according to the present invention.
Figure 3B:
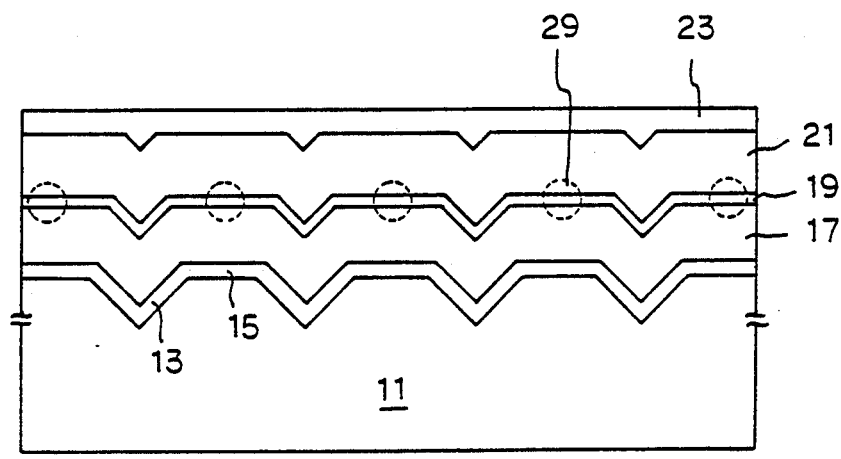
Figure 3C:
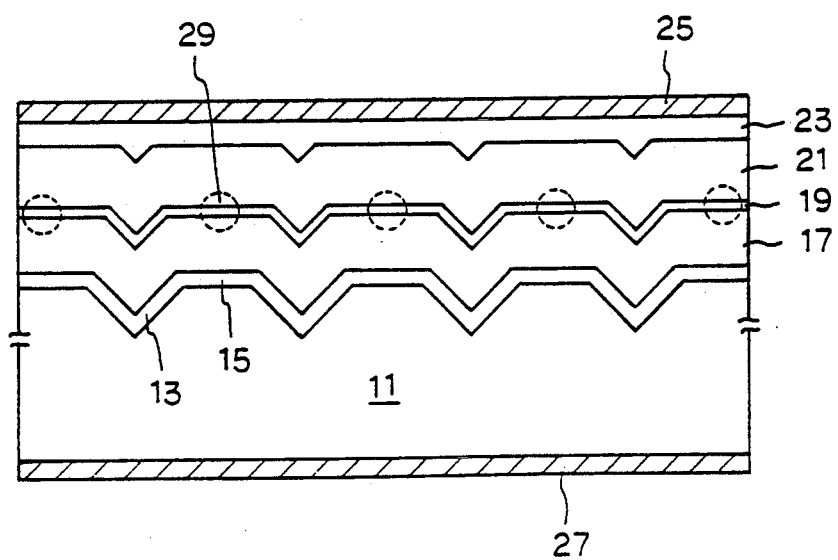

Also, the outer regions of the V-channel stabilize the mode of the light generated from the P-type GaAs layer 19. A P-type electrode 25 of Au/Zn:Au is formed on the P+-type GaAs layer 23 while an N-type electrode 27 of Au/Ge:Ni:Au is formed beneath the N-type GaAs substrate 11. The P-type and N-type electrodes 25 and 27 form the ohmic contacts with the P-type GaAs layer 23 and the N-type GaAs substrate 11, respectively. The marked portions (0) of the P-type GaAs layer 19 are the emitting regions 29. FIGS. 3(A)–3(C) show a sequence of manufacturing an LD array according to the present invention.

In FIG. 3(A), a number of V-channels are formed by the mesa etching of the N-type GaAs substrate 11 with {100} plane. The used etchant is a mixture of which composition ratio is $H_3PO_4:H_2O = 1:10$. The plane in which Ga is exposed at the V-channel is a {111} A plane.

In FIG. 3(B), on the N-type GaAs substrate 11 with a number of V-channels, the P-type and N-type GaAs layers 13 and 15, the N-type $Al_xGa_{1-x}As$ layer 17, the P-type GaAs layer 19, the P-type $Al_xGa_{1-x}As$ layer 21 and the P+-type GaAs layer 23 are sequentially formed at 600°~650° C. by the MBE technique. Especially, the MBE technique can precisely control the thickness in crystal growth. When the Si-doped GaAs layers 13 and 15 are grown by the MBE technique, Si dopant acts as the N-type dopant at the {100} plane, while the same acts as the N-type dopant at the {111} A plane so that the P-type GaAs layer 13 is formed on the V-channel region, while the N-type GaAs layer 15 is formed on the outer region of the V-channel. The P-type and N-type GaAs layers 13 and 15 formed as above are used as the current limiting layers.

That is, electrons can not pass through the V-channel facets, but pass through the regions between the V-channels only. The N-type and P-type $Al_xGa_{1-x}As$ layers, which are used as the first and second cladding layers, are doped by impurities such as Si or Be of $5 \times 10^{16} \sim 5 \times 10^{17}$ ions/cm$^3$, and their thickness is about 0.5 μm. The P-type GaAs layer 19, which is used as the active layer, is formed with a thickness of 0.5 μm. The P+-type GaAs layer 23, which is used as the cap layer, is doped by impurities such as Be of $1 \times 10^{19}$ ions/cm$^3$ and its thickness is about 0.2 μm.

Figure 1:
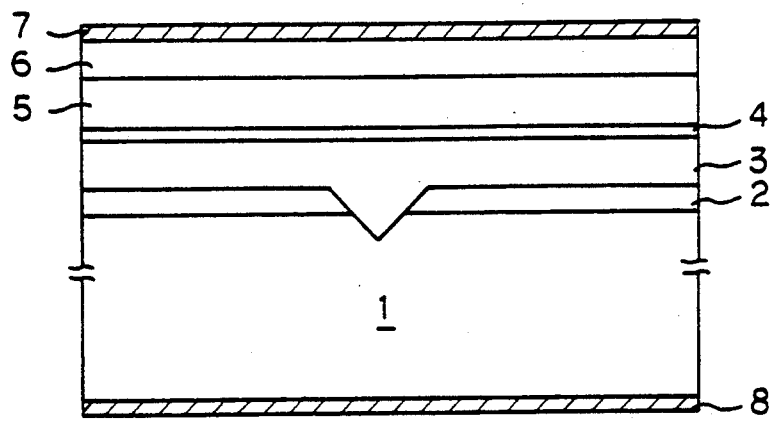
FIG. 1 is a vertical cross sectional view of a conventional VSIS LD.

In FIG. 1(c), the P-type electrode 25 is formed on the P+-type GaAs layer 23 and the N-type electrode 27 is formed beneath the N-type GaAs substrate 11, respectively. An alloy of Au/Ze:Au is used for the P-type electrode 25 and an alloy of Au/Ge:Ni:Au is used for the N-type electrode 27.

As mentioned up to now, the present invention utilizes the fact that when the Si-doped GaAs layer is grown by MBE, Si acts as the P-dopant at the {111} A plane and as the N-dopant at the {100} plane, and the LD array according to the present invention has a phase-locked high output characteristics since the beams generated from each laser element are intercoupled.

Thus, the present invention can stabilizes the optical output efficiency and mode control and improves the yield and reproducibility which are difficult to expect in the conventional LD array where the emitting and insulating regions are alternately formed on the planar structure by using the N-type GaAs substrate with the V-channels. Also, the manufacturing process is easy since one-step epitaxy is used.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A laser diode array comprising:

a compound semiconductor substrate of a first conductivity type having a number of spaced apart V-shaped channels at a surface of said substrate;

a first semiconductor layer disposed on said surface and being of a second conductivity type where said first layer is disposed within said V-shaped grooves and being of said first conductivity type where said first layer is disposed between said grooves;

a second layer of said first conductivity type overlying said first layer;

a third semiconductor layer overlying said second layer;

a fourth semiconductor layer overlying said third layer; said third and fourth layers being of said second conductivity type; and electrodes for passing electrical current from said substrate to said second layer through those portions of said substrate surface between said grooves.

2. A laser diode array according to claim 1 wherein said substrate is of GaAs.

3. A laser diode array according to claim 1 wherein said first conductivity type is N-type and said second conductivity type is P-type.

4. A laser diode array according to claim 1 wherein the portions of said substrate between said grooves lie in the {100} plane of the substrate, and sides of the V-shaped grooves lie in the {111} A plane.

5. A method of fabricating a laser diode array comprising the steps of:

forming a number of spaced apart V-shaped channels by mesa etching a surface of a compound semiconductor of a first conductivity type;

forming a first semiconductor layer on said surface, said first layer being of a second conductivity type where it is formed overlying said V-shaped grooves and being of said first conductivity type where it overlies said surface between said grooves;

forming a second semiconductor layer of said first conductivity type on said first layer;

forming third and fourth semiconductor layers of said second conductivity type, in the named order, overlying said second layer, and forming electrodes for passing current through various portions of said layers.

* * * * *